(12) United States Patent
Xie et al.

(10) Patent No.: US 9,960,271 B1
(45) Date of Patent: May 1, 2018

(54) METHOD OF FORMING VERTICAL FIELD EFFECT TRANSISTORS WITH DIFFERENT THRESHOLD VOLTAGES AND THE RESULTING INTEGRATED CIRCUIT STRUCTURE

(71) Applicant: GLOBALFOUNDRIES INC., Grand Cayman (KY)

(72) Inventors: Ruilong Xie, Schenectady, NY (US); Chun-chen Yeh, Danbury, CT (US); Tenko Yamashita, Schenectady, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/490,255

(22) Filed: Apr. 18, 2017

(51) Int. Cl.
| | |
|---|---|
| *H01L 21/336* | (2006.01) |
| *H01L 29/78* | (2006.01) |
| *H01L 29/66* | (2006.01) |
| *H01L 21/8234* | (2006.01) |
| *H01L 21/311* | (2006.01) |
| *H01L 27/088* | (2006.01) |

(52) U.S. Cl.
CPC .... *H01L 29/7827* (2013.01); *H01L 21/31111* (2013.01); *H01L 21/823418* (2013.01); *H01L 21/823437* (2013.01); *H01L 21/823468* (2013.01); *H01L 21/823487* (2013.01); *H01L 27/088* (2013.01); *H01L 29/6656* (2013.01); *H01L 29/66666* (2013.01)

(58) Field of Classification Search
CPC ................... H01L 21/31111; H01L 21/823418
USPC ........................................................ 438/268
See application file for complete search history.

(56) References Cited

U.S. PATENT DOCUMENTS

| | | |
|---|---|---|
| 5,637,898 A | 6/1997 | Baliga |
| 7,148,541 B2 | 12/2006 | Park et al. |
| 9,087,897 B1 | 7/2015 | Anderson et al. |
| 9,299,835 B1 | 3/2016 | Anderson et al. |
| 9,536,793 B1 | 1/2017 | Zhang et al. |
| 2017/0222048 A1* | 8/2017 | Balakrishnan .... H01L 21/26513 |

* cited by examiner

*Primary Examiner* — David S Blum
(74) *Attorney, Agent, or Firm* — Gibb & Riley, LLC; Yuanmin Cai, Esq.

(57) ABSTRACT

An integrated circuit and method are disclosed. In the method, a stack of sacrificial layers is formed on a semiconductor layer such that a first portion of the stack has an extra sacrificial layer as compared to a second portion. First and second multi-layer fins are etched through the first and second portions and into the semiconductor layer. First and second vertical field effect transistors (VFETs) are formed using the fins. During VFET formation, multiple etch processes are performed to remove the sacrificial layers. The last of these etch processes is a selective isotropic etch process that removes the extra sacrificial layer and etches back first and second upper dielectric spacers on the first and second multi-layer fins. Due to the extra sacrificial layer, the first upper dielectric spacer will be taller than the second and the first VFET will have a higher threshold voltage than the second.

15 Claims, 18 Drawing Sheets

METHOD OF FORMING VERTICAL FIELD EFFECT TRANSISTORS WITH DIFFERENT THRESHOLD VOLTAGES AND THE RESULTING INTEGRATED CIRCUIT STRUCTURE

BACKGROUND

Field of the Invention

The present invention relates to integrated circuit (IC) structures with vertical field effect transistors (VFETs) having different threshold voltages (Vts) and, thereby different switching speeds. More particularly, the present invention relates to a method of forming multiple VFETs with different Vts on the same substrate and to the resulting IC structures.

Description of the Related Art

Integrated circuit (IC) design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel. It should be noted that, because the semiconductor fin is so thin, any field effects exhibited at the top surface are insignificant (i.e., negligible). Recently, vertical devices and, particularly, vertical field effect transistors (VFETs) have been developed that allow for increased device density (i.e., a greater number of devices within a given area). While multiple essentially identical VFETs can produced on a substrate with minimal impact on manufacturing efficiency and costs, oftentimes IC designs require devices with different switching speeds (e.g., due to different threshold voltages (Vts)) and forming vertical VFETs with different switching speeds on the same substrate can be challenging.

SUMMARY

Disclosed herein is a method of forming an integrated circuit (IC) structure with multiple vertical field effect transistors (VFETs) having different threshold voltages (Vts) and, thereby different switching speeds.

Generally, the method includes forming a stack of sacrificial layers on a semiconductor layer. The stack can be formed such that a first portion of the stack on a first device region has an extra sacrificial layer as compared to a second portion of the stack on a second device region. First and second multi-layer fins can be etched in the first and second portions of the stack, respectively, and into the semiconductor layer. First and second vertical field effect transistors (VFETs) can be concurrently formed using the first and second multi-layer fins, respectively. During formation of the first and second VFETs, first and second upper dielectric spacers can be formed on the first and second multi-layer fins, respectively. Additionally, multiple etch processes can be performed to remove the sacrificial layers from the first and second multi-layer fins. These etch processes can include initial etch processes, which remove all of the sacrificial layers except for the extra sacrificial layer on the first multi-layer fin, and an isotropic etch process, which removes the extra sacrificial layer from the first multi-layer fin and also etches back the first upper dielectric spacer and the second upper dielectric spacer. However, due to the presence of the extra sacrificial layer in the first multi-layer fin, the second upper dielectric spacer is etched back to a greater degree than the first upper dielectric spacer. Specifically, wherein, during the isotropic etch process, the first upper dielectric spacer is partially protected by the extra sacrificial layer until the extra sacrificial layer is removed and, thus, the second upper dielectric spacer is etched back faster than the first upper dielectric spacer. As a result, the first upper dielectric spacer in the first VFET will be taller than the second upper dielectric spacer in the second VFET.

In one particular embodiment of the method, a semiconductor layer can be provided and a stack of sacrificial layers can be formed on the semiconductor layer. To form the stack of sacrificial layers, a first sacrificial layer can be formed on a first device region of the semiconductor layer. Then, a second sacrificial layer can be formed on a second device region of the semiconductor layer and further on the first sacrificial layer. Next, a third sacrificial layer over the second sacrificial layer and a fourth sacrificial layer can be formed over the third sacrificial layer. Thus, the stack of sacrificial layers will have a first portion on the first device region and a second portion, which is different from the first portion, on the second device region. Specifically, the first portion will have the first sacrificial layer (i.e., the extra sacrificial layer) and the second portion will be devoid of this layer. After the stack of sacrificial layers is formed, multi-layer fins can be etched into the different portions of the stack and the semiconductor layer. Specifically, a first multi-layer fin can be etched in the first portion of the stack of sacrificial layers and the semiconductor layer and a second multi-layer fin can be etched in the second portion of the stack of sacrificial layers and the semiconductor layer. Vertical field effect transistors (VFETs) can then be concurrently formed using the multi-layer fins. Specifically, a first VFET can be formed using the first multi-layer fin and a second VFET can be concurrently formed using the second multi-layer fin.

During formation of the first VFET and the second VFET, a first upper dielectric spacer can be formed above a first gate and positioned laterally adjacent to first sidewalls of the first multi-layer fin and a second upper dielectric spacer can be formed above a second gate and positioned laterally adjacent to second sidewalls of the second multi-layer fin. Then, multiple etch processes can be performed to remove the sacrificial layers from the first multi-layer fin and the second multi-layer fin, thereby creating a first semiconductor fin and a second semiconductor fin, respectively. Specifically, following removal of the sacrificial layers, only the portions of the first and second multi-layer fins that were etched into the semiconductor layer will remain such that the remaining portions can be simply described as first and second semiconductor fins, respectively. The multiple etch processes include initial etch processes, which remove all of the sacrificial layers except for the first sacrificial layer (i.e., the extra sacrificial layer) on the first multi-layer fin, and an isotropic etch process, which removes the first sacrificial layer (i.e., the extra sacrificial layer) from the first multi-layer fin and also etches back the first upper dielectric spacer and the second upper dielectric spacer. It should be noted that, due to the presence of the first sacrificial layer on the first multi-layer fin, the second upper dielectric spacer is etched back to a greater degree than the first upper dielectric spacer. Specifically, during the isotropic etch process, the first upper dielectric spacer is partially protected by the first sacrificial layer (i.e., extra sacrificial layer) until that first sacrificial layer is removed and, thus, the second upper dielectric spacer is etched back faster than the first upper dielectric spacer. As a result, in the IC structure, the first upper dielectric spacer will be above the first gate and positioned laterally adjacent to the first semiconductor fin and the second upper dielectric spacer will similarly be above the second gate and positioned laterally adjacent to the second semiconductor fin, but the first upper dielectric spacer will be taller than the second upper dielectric spacer.

In the method described above, as result of the first upper dielectric spacer in the first VFET being taller than the second upper dielectric spacer in the second VFET, spacing between a subsequently formed first upper source/drain region and a first channel region in the first semiconductor fin of the first VFET will be greater than spacing between a subsequently formed second upper source/drain region and a second channel region in the second semiconductor fin of the second VFET. This difference in spacing between the upper source/drain regions and the channel regions of the two VFETs causes the first Vt of the first VFET to be greater than the second Vt of the second VFET and, thereby causes the first switching speed of the first VFET to be slower than the second switching speed of the second VFET.

Also disclosed herein is an integrated circuit (IC) structure formed according to the disclosed method so as to have multiple vertical field effect transistors (VFETs) with different threshold voltages (Vts) and, thereby different switching speeds. Specifically, the IC structure can include a first VFET and a second VFET on a semiconductor substrate.

The first VFET can have a first lower source/drain region and a first upper source/drain region. A first semiconductor fin can extend essentially vertically from the first lower source/drain region to the first upper source/drain region. A first gate can laterally surround the first semiconductor fin at a first channel region and dielectric spacers can physically separate the the first gate from the first lower source/drain region and the first upper source/drain region. That is, a first lower dielectric spacer can be positioned laterally adjacent to the first semiconductor fin and stacked between the first lower source/drain region and the first gate. Additionally, a first upper dielectric spacer can be positioned laterally adjacent to the first semiconductor fin and can be stacked between the first gate and the first upper source/drain region.

Similarly, the second VFET can have a second lower source/drain region and a second upper source/drain region. A second semiconductor fin can extend essentially vertically from the second lower source/drain region to the second upper source/drain region. A second gate can laterally surround the second semiconductor fin at a second channel region and dielectric spacers can physically separate the the second gate from the second lower source/drain region and the second upper source/drain region. That is, a second lower dielectric spacer can be positioned laterally adjacent to the second semiconductor fin and stacked between the second lower source/drain region and the second gate. Additionally, a second upper dielectric spacer can be positioned laterally adjacent to the second semiconductor fin and can be stacked between the second gate and the second upper source/drain region.

Thus, the first VFET and the second VFET are almost identical in structure except that, due to the method used to form these VFETs, the first upper dielectric spacer of the first VFET is taller than the second upper dielectric spacer of the second VFET. As a result, spacing between the first upper source/drain region and the first channel region in the first semiconductor fin of the first VFET is greater than spacing between the second upper source/drain region and the second channel region in the second semiconductor fin of the second VFET. This difference in spacing between the channel regions and the upper source/drain regions of the two VFETs causes the first Vt of the first VFET to be greater than the second Vt of the second VFET and, thereby causes the first switching speed of the first VFET to be slower than the second switching speed of the second VFET.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
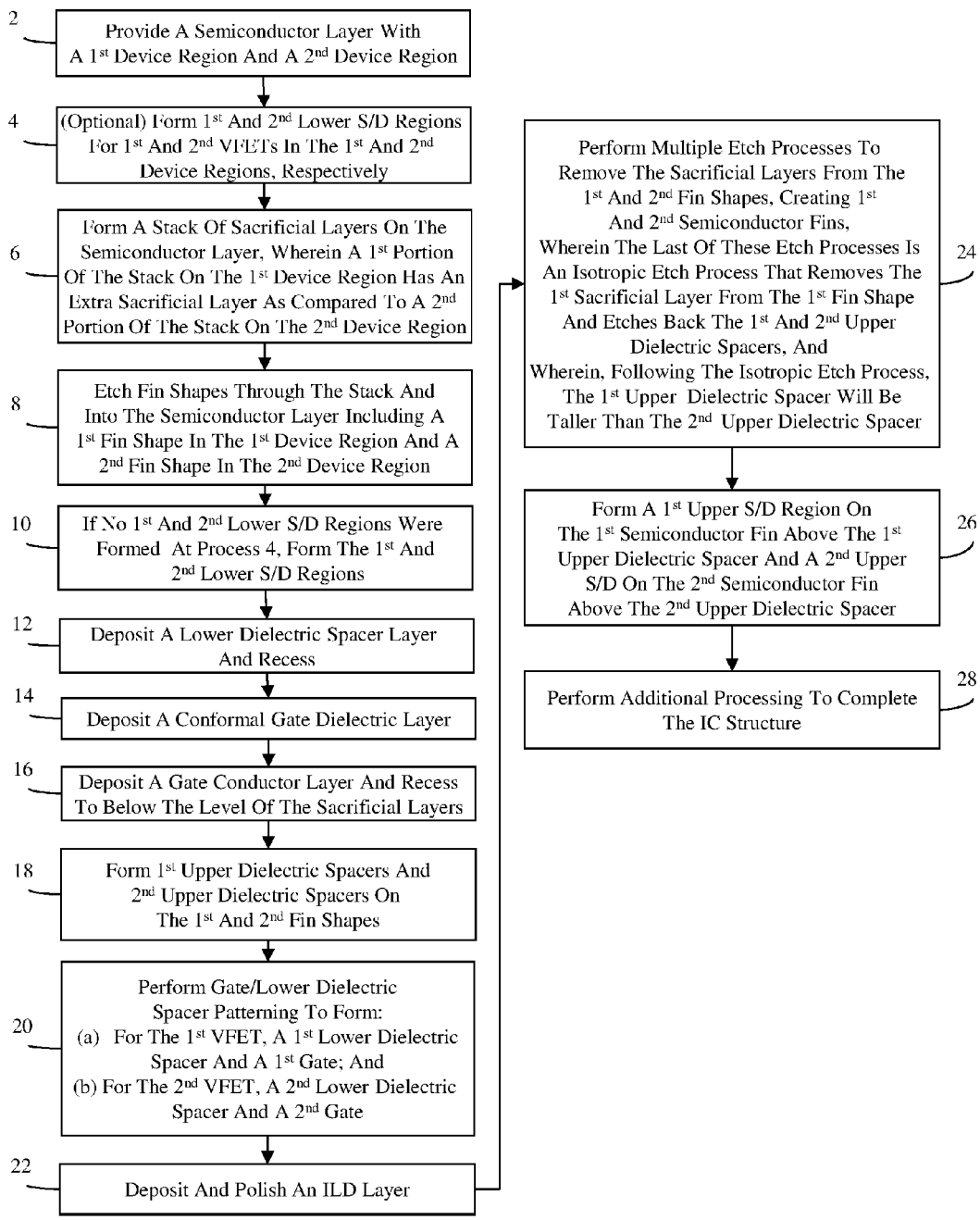
FIG. 1 is a flow diagram illustrating a method of forming an integrated circuit (IC) structure with multiple vertical field effect transistors (VFETs) having the same type conductivity, but different threshold voltages (Vts)

As mentioned above, integrated circuit (IC) design decisions are often driven by device scalability, device density, manufacturing efficiency and costs. For example, size scaling of planar field effect transistors (FETs) resulted in the development of planar FETs with relatively short channel lengths and, unfortunately, the smaller channel lengths resulted in a corresponding increase in short channel effects. In response, non-planar FET technologies (e.g., fin-type FET (FINFET) technologies) were developed. A FINFET is a non-planar FET that incorporates a semiconductor fin (i.e., a relatively tall and thin, elongated, rectangular-shaped, semiconductor body) and, within the semiconductor fin, a channel region positioned laterally between source/drain regions. A gate is positioned adjacent to the top surface and opposing sidewalls of the semiconductor fin at the channel region. Such a FINFET exhibits two-dimensional field effects as compared to the single-dimensional field effects exhibited by a planar FET and, thus, exhibits improved gate control over the channel. It should be noted that, because the semiconductor fin is so thin, any field effects exhibited at the top surface are insignificant (i.e., negligible). Recently, vertical devices and, particularly, vertical field effect transistors (VFETs) have been developed that allow for increased device density (i.e., a greater number of devices within a given area). While multiple essentially identical VFETs can produced on a substrate with minimal impact on manufacturing efficiency and costs, oftentimes IC designs require devices with different switching speeds (e.g., due to different threshold voltages (Vts)) and forming vertical VFETs with different switching speeds on the same substrate can be challenging.

In view of the foregoing, disclosed herein is a method of forming an integrated circuit (IC) structure with multiple vertical field effect transistors (VFETs), including a first VFET and a second VFET, having the same type conductivity (e.g., both P-type VFETs or both N-type VFETs) but different threshold voltages (Vts) and, thereby different switching speeds. In the method, a stack of sacrificial layers can be formed on a semiconductor substrate such that a first portion of the stack has an extra sacrificial layer as compared to a second portion of the stack. First and second multi-layer fins can be etched through the first and second portions of the stack, respectively, and into the semiconductor substrate. First and second vertical field effect transistors (VFETs) can be concurrently formed using the first and second multi-layer fins, respectively. During formation of the first and second VFETs, first and second upper dielectric spacers can be formed on the first and second multi-layer fins, respectively. Additionally, multiple etch processes can be performed to remove the sacrificial layers from the first and second multi-layer fins. The last of these etch processes can be an isotropic etch process, which, not only removes the extra sacrificial layer from the first multi-layer fin, but also etches back the first upper dielectric spacer and the second upper dielectric spacer. However, due to the presence of the extra sacrificial layer in the first multi-layer fin, the second upper dielectric spacer is etched back to a greater degree than the first upper dielectric spacer. As a result, the first upper dielectric spacer in the first VFET will be taller than the second upper dielectric spacer in the second VFET such that spacing between a subsequently formed first upper source/drain region and a first channel region of the first VFET will be greater than spacing between a subsequently formed second upper source/drain region and a second channel region for the second VFET. This difference in spacing causes the first Vt of the first VFET to be greater than the second Vt of the second VFET and, thereby causes the first switching speed of the first VFET to be slower than the second switching speed of the second VFET.

More particularly, referring to the flow diagram of FIG. 1, disclosed herein is a method of forming an integrated circuit (IC) structure.

Figure 2:
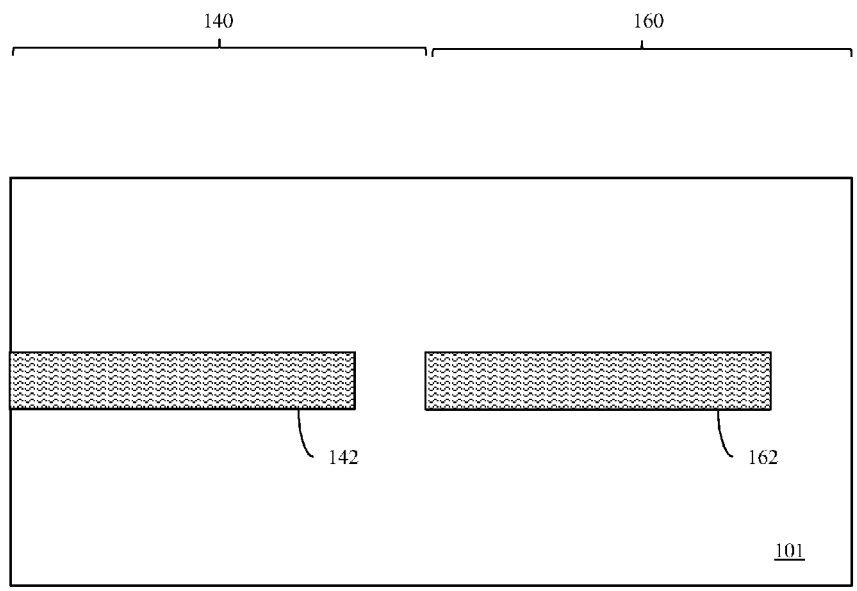
FIG. 2 is a cross-section diagram illustrating a partially completed IC structure formed according to the method of FIG. 1.

The method includes providing a semiconductor layer 101 (2). For example, the semiconductor layer 101 can be a bulk semiconductor wafer, such as a bulk silicon wafer (see FIG. 2). Alternatively, the semiconductor layer 101 can be a semiconductor layer of a semiconductor-on-insulator wafer (e.g., a silicon-on-insulator (SOI) or any other suitable semiconductor-on-insulator wafer). In this case, the semiconductor layer (e.g., the silicon layer) of the semiconductor-on-insulator wafer will be considered the semiconductor substrate upon which processing is performed, as discussed below. In any case, the semiconductor substrate can have areas designated for formation of a first device region 160 and a second device region 140.

The semiconductor layer 101 can be undoped so that channel regions of the VFETs in the resulting structure are undoped, enabling higher mobility. However, optionally, the semiconductor layer 101 can be doped so as to have a first type conductivity at a relatively low conductivity level (e.g., P− conductivity in the case of N-type VFETs or N− conductivity in the case of P-type VFETs) and, thus, so that the first channel region of the first VFET and the second channel region of the second VFET in the resulting structure will also have the first type conductivity at the relatively low conductivity level.

Optionally, the method can include forming, at some predetermined depth below the top surface of the semiconductor substrate, a first lower source/drain region 162 for the first VFET in the first device region 160 and a second lower source/drain region 142 for the second VFET in the second device region 140 (4). Such lower source/drain regions can be formed, for example, by performing one or more masked dopant implantation process to form deep well regions within the different device regions below the top surface of the semiconductor layer. Alternatively, any other suitable technique could be performed to form such lower source/drain regions. For example, trenches can be formed within a semiconductor substrate in different device regions. The trenches could be filled with an in-situ doped semiconductor material to form the lower source/drain regions and the semiconductor layer 101 could subsequently be formed on the top surface of the semiconductor substrate over the lower source/drain region regions (not shown). In any case, the lower source/drain regions can be doped so as to have a second type conductivity at a relatively high conductivity level (e.g., N+ conductivity in the case of N-type VFETs or P+ conductivity in the case of P-type VFETs).

Figure 3:
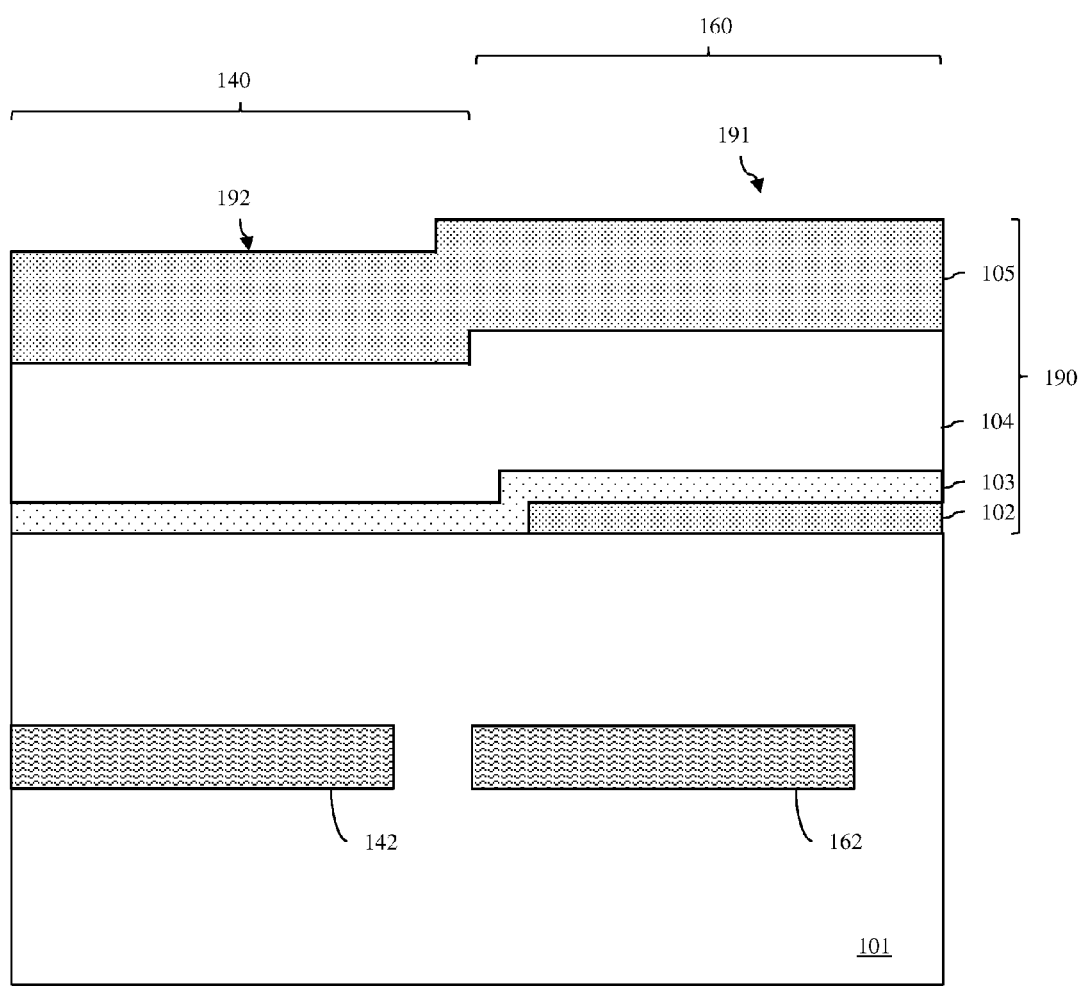
FIG. 3 is a cross-section diagram illustrating a partially completed IC structure formed according to the method of FIG. 1.
Figure 4A:
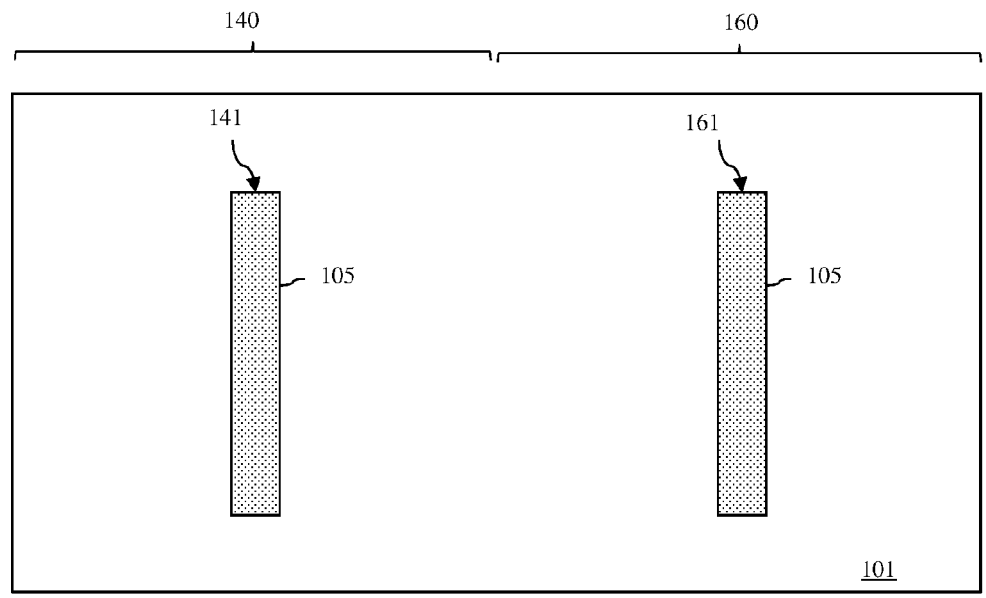
FIGS. 4A and 4B are top view and cross-section diagrams, respectively, illustrating a partially completed IC structure formed according to the method of FIG. 1.
Figure 4B:
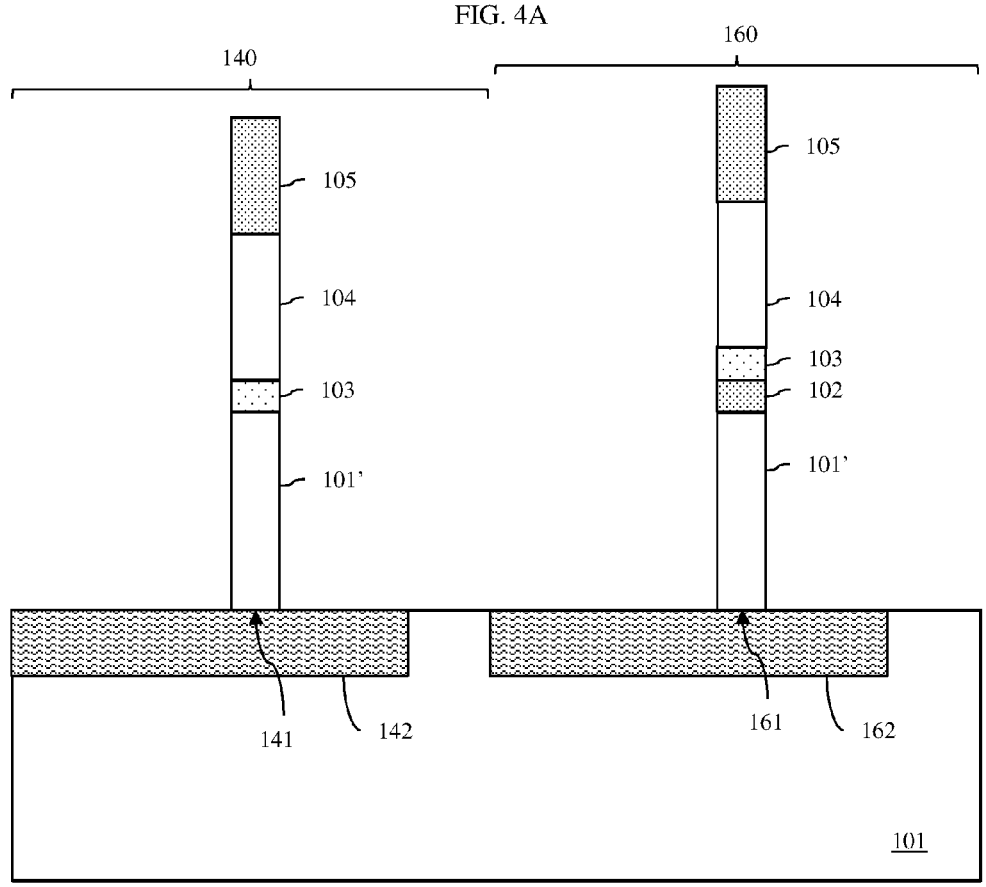

A stack 190 of sacrificial layers can be formed on the semiconductor layer 101 such that a first portion 191 of the stack 190 on the first device region 160 has an extra sacrificial layer as compared to a second portion 192 of the stack 190 on the second device region 140 and, thus, is taller than the second portion 192 (6, see FIG. 3). That is, the height of the first portion 191, as measured from the top surface of the semiconductor layer 101 will be greater than the height of the second portion 192, as measured from the top surface of the semiconductor layer 101.

For example, to form the stack 190 at process 6, a first sacrificial layer 102 can be formed (e.g., deposited) so as to be immediately adjacent to and cover the top surface of the semiconductor layer 101. The first sacrificial layer 102 can subsequently be lithographically patterned and etched so that it is removed from the top surface of the semiconductor layer 101 in the second device region 140, but remains on the top surface of the semiconductor layer 101 in the first device region 160. The first sacrificial layer 102 can be deposited so that it has a predetermined thickness of 2-10 nm (e.g., approximately 2 nm, approximately 3 nm, etc.). As discussed in greater detail below, this predetermined thickness will be approximately equal to the desired difference in spacing between the first channel region and the first upper source/drain region in the first VFET being formed. Next, a second sacrificial layer 103 can be formed (e.g., conformally deposited) so that it is immediately adjacent to and covers the semiconductor layer 101 in the second device region 140 and further so that it extends laterally onto and covers the first sacrificial layer 102. Subsequently, a third sacrificial layer 104 can be formed (e.g., conformally deposited) over the second sacrificial layer 103 and a fourth sacrificial layer 105 can be formed (e.g., conformally deposited) over the third sacrificial layer 104.

It should be noted that in the above described stack 190, the first sacrificial layer 102, the second sacrificial layer 103 and the third sacrificial layer 104 can all be made of different sacrificial materials so that these layers can be selectively etched away during subsequent processing. The fourth sacrificial layer 105 can further be made of a different sacrificial material than the sacrificial materials of the second sacrificial layer 103 and the third sacrificial layer 104 and, optionally, can be made of the same sacrificial material as the first sacrificial layer 102.

For example, in one embodiment, the first sacrificial layer 102 can be a sacrificial silicon nitride layer; the second sacrificial layer 103 can be a sacrificial silicon dioxide layer; the third sacrificial layer 104 can be a sacrificial amorphous silicon layer; and the fourth sacrificial layer 105 can be an additional sacrificial silicon nitride layer. In any case, the first sacrificial layer 102 and the second sacrificial layer 103 can each be relatively thin as compared to the third sacrificial layer 104 and the fourth sacrificial layer 105. Such a stack 190 of sacrificial layers will have a first portion 191 on the first device region 160 and a second portion 192, which is different from the first portion 191, on the second device region 140. The first portion 191 will have one extra sacrificial layer (namely, the first sacrificial layer 102) and the second portion 192 will be devoid of this layer. Thus, the first portion 191 of the stack 190 will be taller than the second portion 192 by an amount equal to the thickness of the first sacrificial layer 102 (e.g., by 2-10 nm).

After the stack 190 of sacrificial layers is formed at process 6, multi-layer fins can be formed (e.g., lithographically patterned and etched) into the different portions 191-192 of the stack 190 and into the semiconductor layer 101 below (8). That is, the same lithographic patterning and etch processes can be used to essentially simultaneously form a first multi-layer fin 161 in the first device region 160 and a second multi-layer fin 141 in the second device region 140. Specifically, the first multi-layer fin 161 can be etched into the first portion 191 of the stack 190 of sacrificial layers and further into at least the upper portion 101' of the semiconductor layer 101 in the first device region 160 and the second multi-layer fin 141 can be etched into the second portion 192 of the stack 190 of sacrificial layers and further into the upper portion 101' of the semiconductor layer 101 in the second device region 140. In the case where the first lower source/drain region 162 and the second lower source/drain region 142 are already formed this etch process can be performed so as to expose the lower source/drain regions and, thereby such that the bottom of the first multi-layer fin 161 is immediately adjacent to the first lower source/drain region 162 and such that the bottom of the second multi-layer fin 141 is immediately adjacent to the second lower source/drain region 142 (as illustrated).

In any case, the layers of the first multi-layer fin 161 will include the upper portion 101' of the semiconductor layer, the first sacrificial layer 102 (i.e., the extra sacrificial layer), the second sacrificial layer 103, the third sacrificial layer 104 and the fourth sacrificial layer 105; whereas, the layers of the second multi-layer fin 141 will only include the upper portion 101' of the semiconductor layer, the second sacrificial layer 103, the third sacrificial layer 104 and the fourth sacrificial layer 105. Thus, due to the presence of the first sacrificial layer 102 in the first multi-layer fin 161, the first multi-layer fin 161 will be taller than the second multi-layer fin 141 by an amount equal to the thickness of the first sacrificial layer 102 (e.g., by 2-10 nm).

Vertical field effect transistors (VFETs) can then be concurrently formed using these multi-layer fins (10)-(28).

Figure 5:
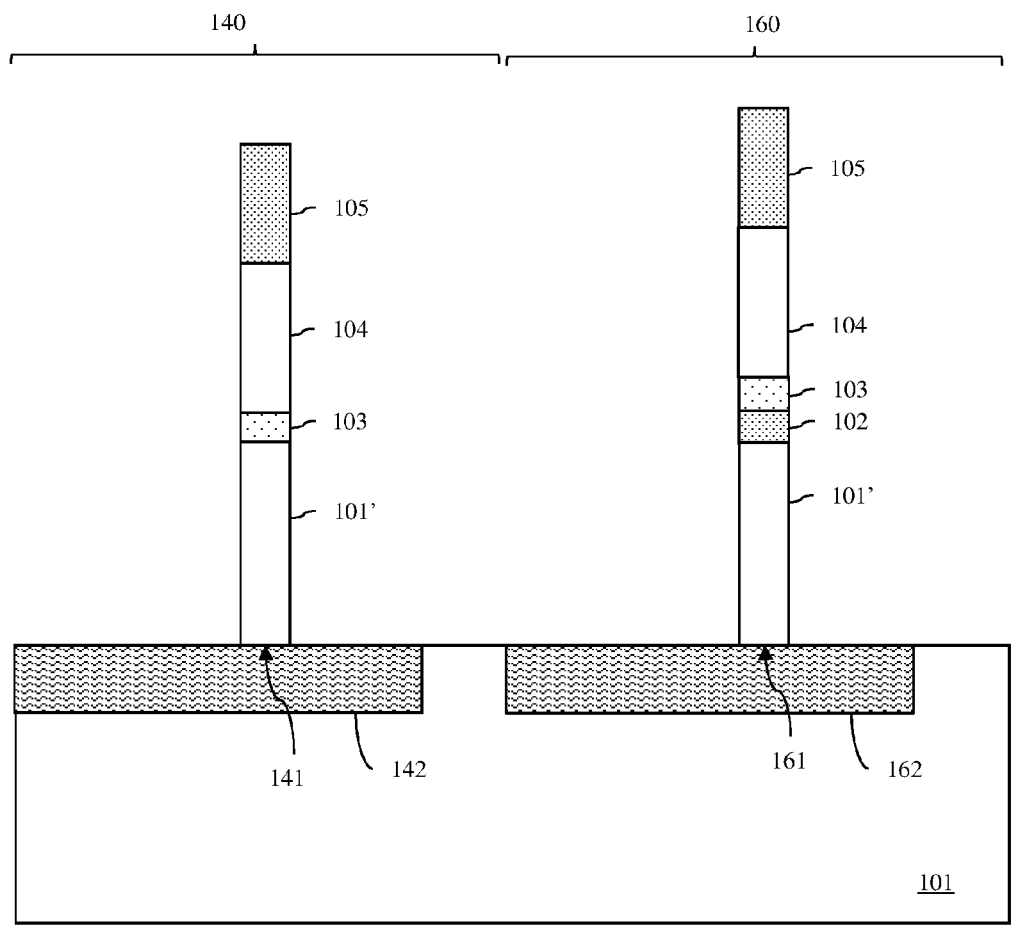
FIG. 5 is a cross-section diagram illustrating a partially completed IC structure formed according to the method of FIG. 1.

Specifically, if lower source/drain regions for the VFETs were not previously formed at process 4, a first lower source/drain region 162 can now be formed in the semiconductor layer 101 adjacent to the bottom of the first multi-layer fin 161 and a second lower source/drain region 142 can now be formed in the semiconductor layer 101 adjacent to the bottom of the second multi-layer fin 141 (10, see FIG. 5). The lower source/drain regions 162, 142 can be formed, for example, as dopant implant regions, doped epitaxial semiconductor regions, etc. Various different techniques for forming lower source/drain regions for VFETs are well known in the art and, thus, the details of these techniques have been omitted from this specification in order to allow the reader to focus on the salient aspects of the disclosed methods. In any case, the lower source/drain regions can be doped so as to have a second type conductivity at a relatively high conductivity level (e.g., N+ conductivity in the case of N-type VFETs or P+ conductivity in the case of P-type VFETs).

Figure 6:
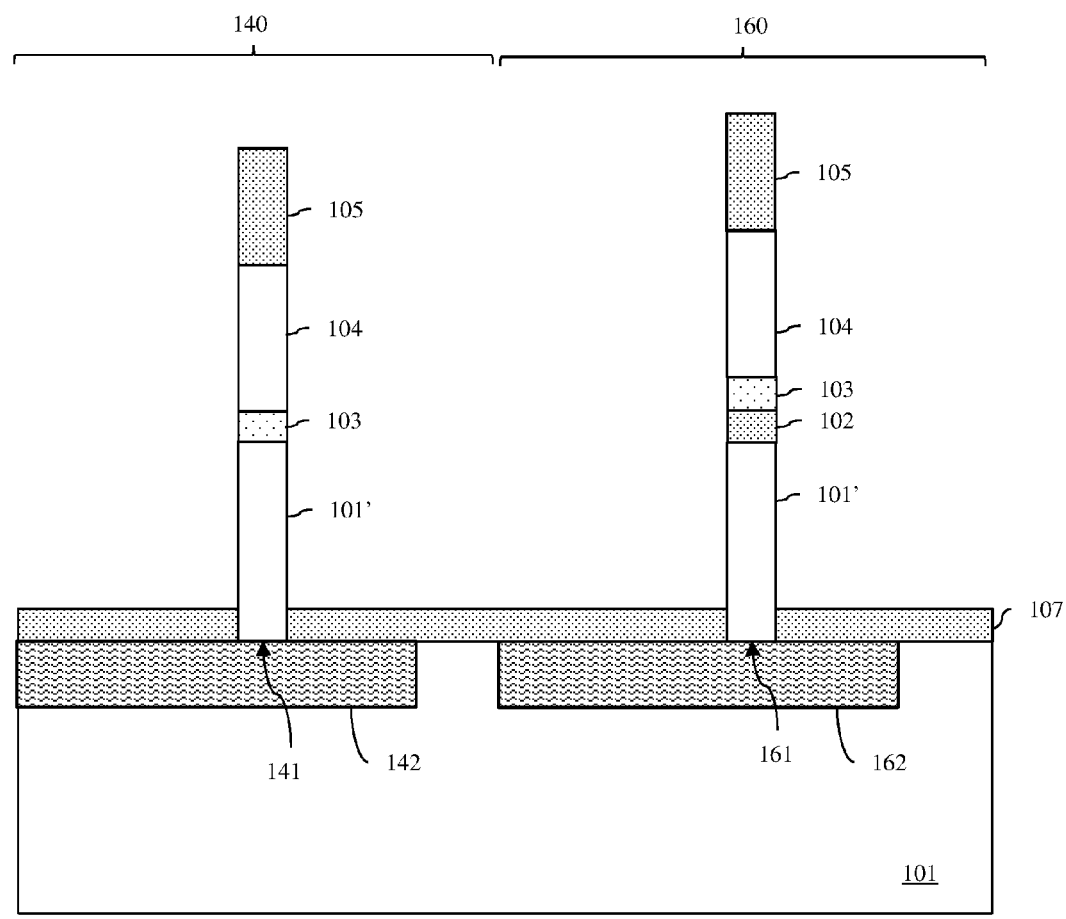
FIG. 6 is a cross-section diagram illustrating a partially completed IC structure formed according to the method of FIG. 1.

Next, a lower dielectric spacer layer 107 can be deposited over the partially completed structure and then recessed (12, see FIG. 6). As a result, the lower dielectric spacer layer 107 will be positioned above and immediately adjacent to both the first lower source/drain region 162 and the second lower source/drain region 142 and will further be positioned laterally around and immediately adjacent to the first sidewalls of the first multi-layer fin 161 and the second sidewalls of the second multi-layer fin 141. The lower dielectric spacer layer 107 can be made, for example, of silicon nitride.

Figure 7:
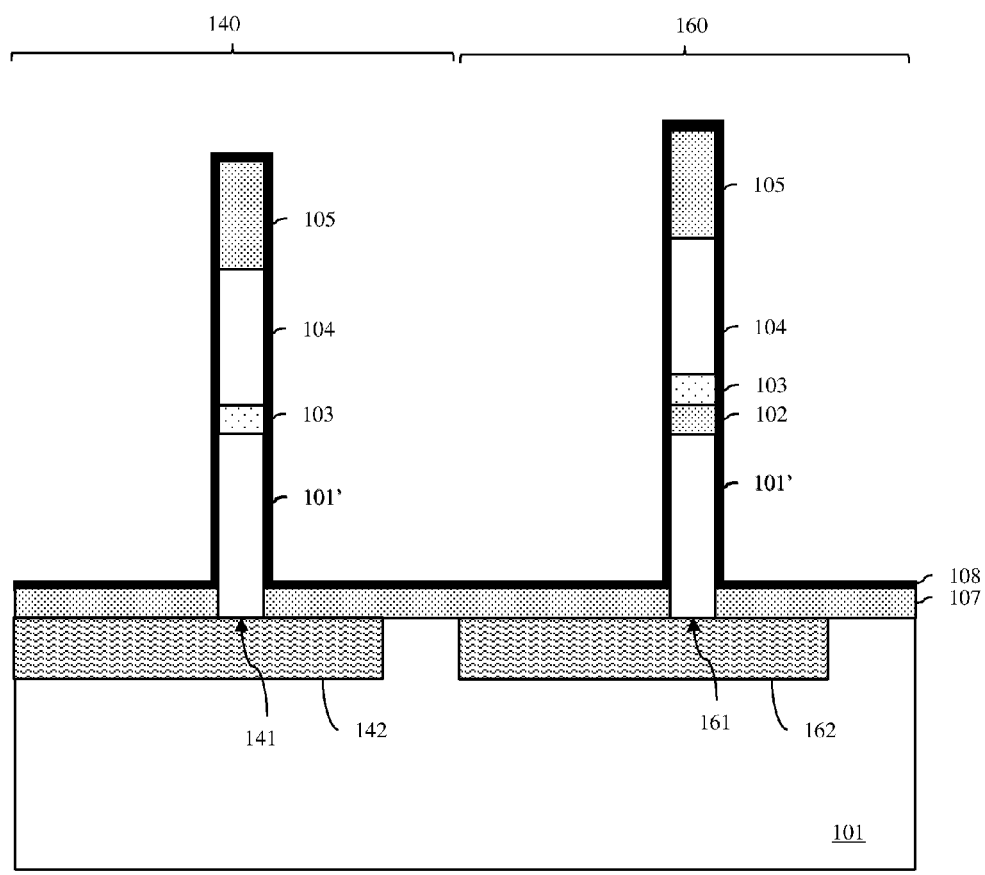
FIG. 7 is a cross-section diagram illustrating a partially completed IC structure formed according to the method of FIG. 1.

A gate dielectric layer 108 can then be conformally deposited over the partially completed structure (i.e., onto the lower dielectric spacer layer 107 and over the first multi-layer fin 161 and the second multi-layer fin 141) (14, see FIG. 7). The gate dielectric layer 108 can be a silicon dioxide gate dielectric layer. Alternatively and preferably, the gate dielectric layer 108 can be a high-K gate dielectric layer. The high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Techniques for conformally depositing such gate dielectric materials are well known in the art and, thus, the details have been omitted from this specification in order to allow the reader to focus on the salient aspects of the disclosed methods.

Figure 8:
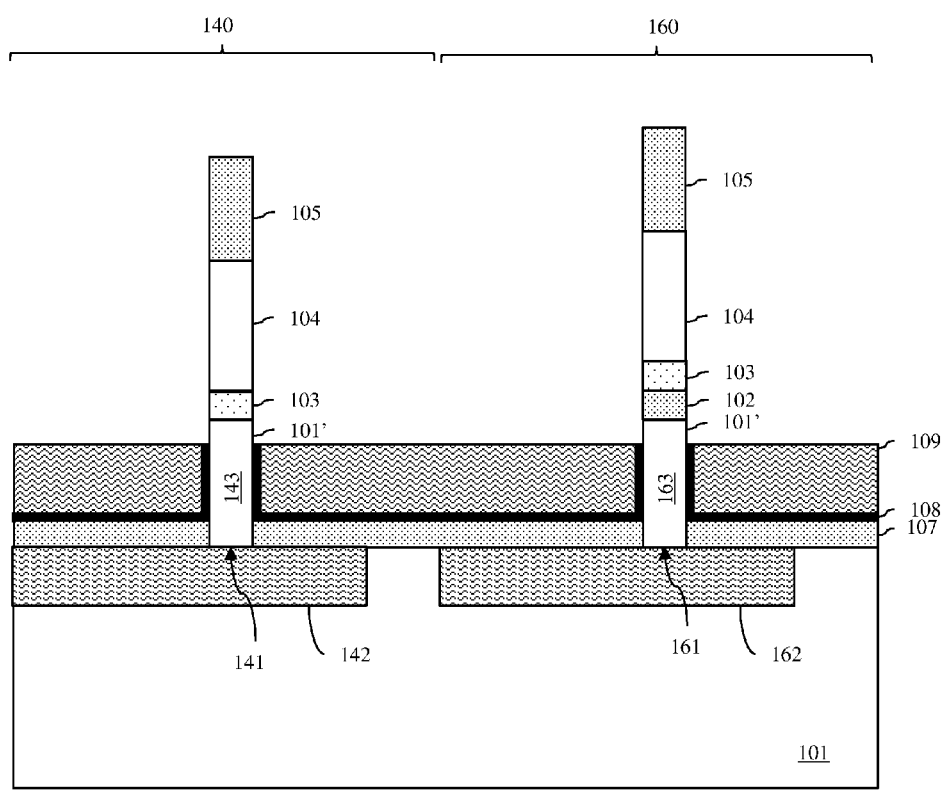
FIG. 8 is a cross-section diagram illustrating a partially completed IC structure formed according to the method of FIG. 1.

Next, at least one gate conductor layer 109 can be formed on the gate dielectric layer 108 and recessed so that the top surface of the gate conductor layer 109 is below the level of the bottom of the stack of sacrificial layers in each of the multi-layer fins (16, see FIG. 8). The gate conductor layer 109 can be, for example, an in situ doped polysilicon gate conductor layer. Alternatively and preferably, the gate conductor layer 109 can include a conformal work function metal layer and a fill metal layer on the conformal work function metal layer. The metal material or metal alloy material of such the work function metal layer can be preselected in order to achieve the optimal gate conductor work function given the conductivity type of the FET. For example, the optimal gate conductor work function of N-type VFETs will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a P-type VFETs will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten, aluminum and cobalt. It should be noted that, depending upon the selective etch process used to recess the gate conductor layer 109, the gate dielectric layer 108 may also be recessed, as illustrated. Alternatively, the gate dielectric layer 108 may remain on the top surfaces and sidewalls of the multi-layer fins.

Figure 9:
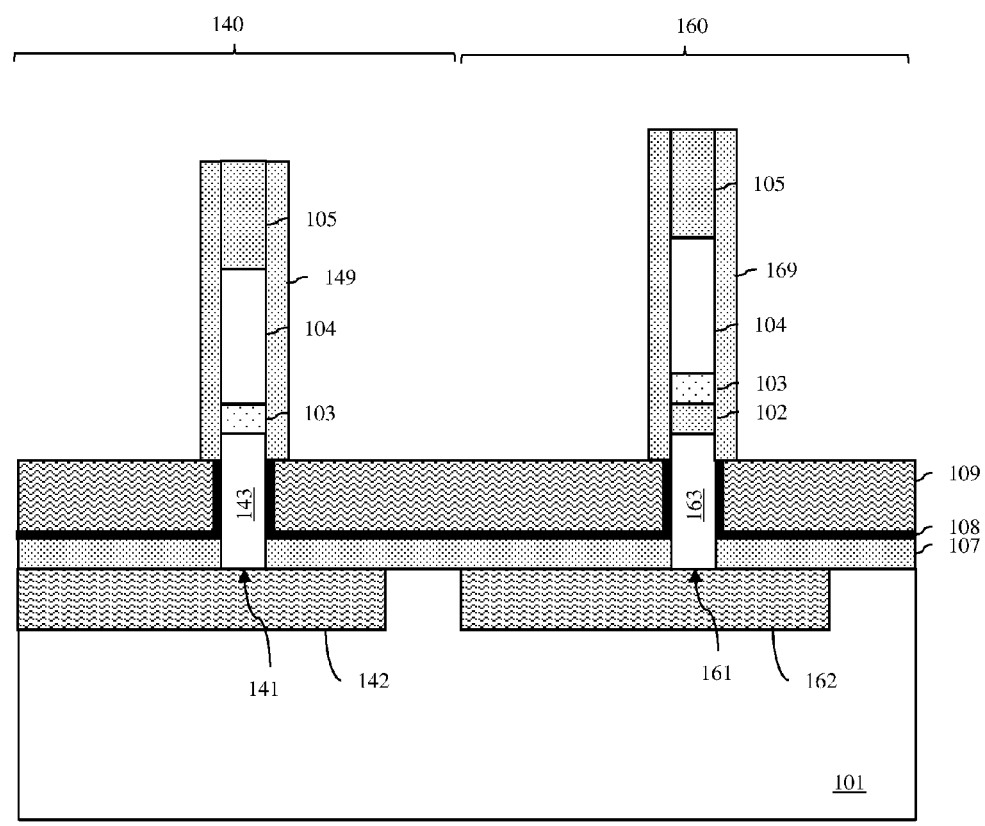
FIG. 9 is a cross-section diagram illustrating a partially completed IC structure formed according to the method of FIG. 1.

Upper dielectric spacers 169, 149 can then be formed on the sidewalls of the exposed portions of the multi-layer fins 161, 141 (18, see FIG. 9). The upper dielectric spacers can be formed, for example, using conventional sidewall spacer formation techniques. That is, a relatively thin conformal upper dielectric spacer layer can be deposited over the partially completed structure. A directional etch process can then be performed in order to remove horizontal portions of the upper dielectric spacer layer from horizontal surfaces, leaving vertical portions of the upper dielectric spacer layer intact and thereby forming a first upper dielectric spacer 169 above the gate conductor layer 109 and positioned laterally immediately adjacent to the first sidewalls of the first multi-layer fin 161 and a second upper dielectric spacer 149 above the gate conductor layer 109 and positioned laterally immediately adjacent to the second sidewalls of the second multi-layer fin 141. The upper dielectric spacer layer can be made, for example, of silicon nitride and, thus, the first upper dielectric spacer 169 and the second upper dielectric spacer 149 can be silicon nitride spacers.

Subsequently, a gate/lower dielectric spacer patterning process can be performed (20).

Figure 10:
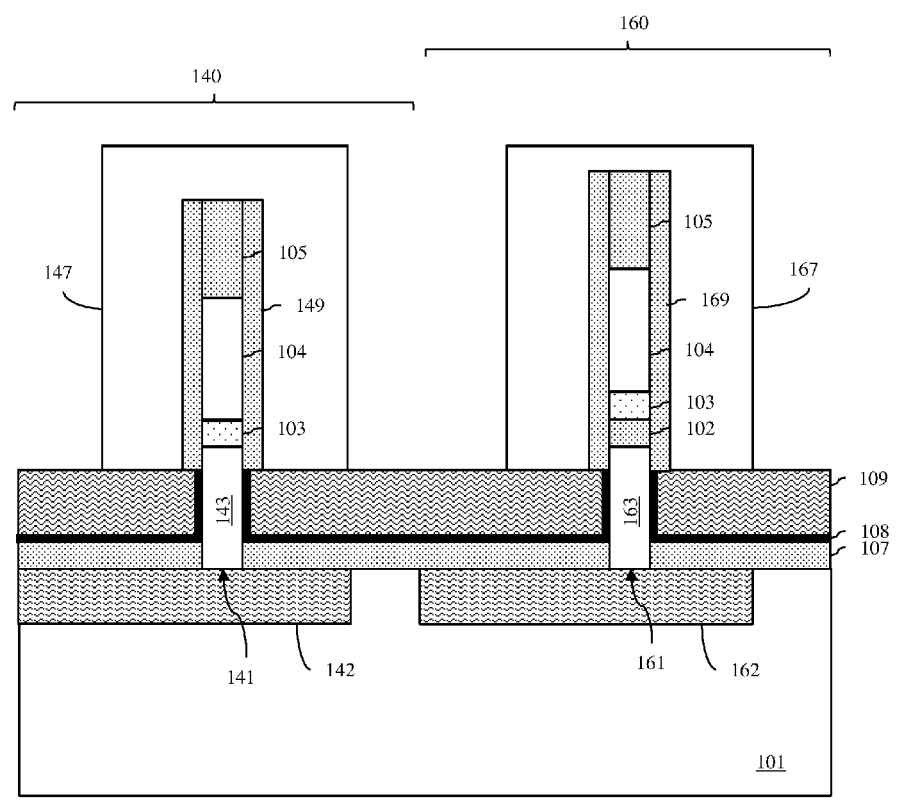
FIG. 10 is a cross-section diagram illustrating a partially completed IC structure formed according to the method of FIG. 1.
Figure 11:
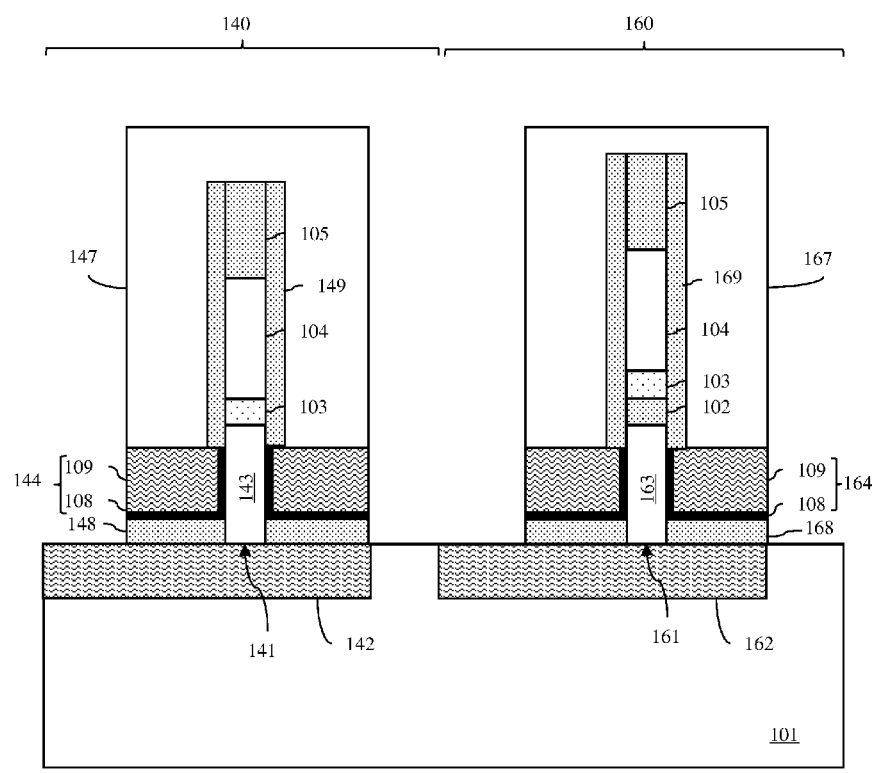
FIG. 11 is a cross-section diagram illustrating a partially completed IC structure formed according to the method of FIG. 1.

For example, conventional lithographic patterning and etch processes could be performed to pattern the gate and lower dielectric spacer at process 20. That is, a blanket mask layer (e.g., an optical planarization layer (OPL)) can be deposited (e.g., using a spin-on process) so as to cover the partially completed structure. Optionally, the mask layer can further be etched back and additional OPL material can be re-deposited to improve uniformity. Then, an anti-reflective coating (ARC) can be formed on the top surface of the mask layer and a photoresist layer can be formed on the ARC. The photoresist layer can be patterned with desired gate/lower dielectric spacer shapes above first device region and the second device region. Directional etch processes can then be performed to transfer the image of these shapes through the ARC and into and through the mask layer, thereby forming a first mask 167 over and on opposing sides of the first multi-layer fin 161 and a second mask 147 over and on opposing sides of the second multi-layer fin 141 (see FIG. 10). Using the first mask 167 and the second mask 147, additional directional etch processes can be performed to etch through the gate conductor layer 109, the gate dielectric layer 108 and the lower dielectric spacer layer 107, thereby forming the following: for the first VFET, a first lower dielectric spacer 168 above and immediately adjacent to the first lower source/drain region 162 and laterally surrounding and immediately adjacent to the first sidewalls of the first multi-layer fin 161 and a first gate 164 (including portions of the gate dielectric layer 108 and gate conductor layer 109) above and immediately adjacent to the first lower dielectric spacer 168 and laterally surrounding and immediately adjacent to the first sidewalls of the first multi-layer fin 161 at a first channel region 163; and, for the second VFET, a second lower dielectric spacer 148 above and immediately adjacent to the second lower source/drain region 142 and laterally surrounding and immediately adjacent to the second sidewalls of the second multi-layer fin 141 and a second gate 144 (including portions of the gate dielectric layer 108 and gate conductor layer 109) above and immediately adjacent to the second lower dielectric spacer 148 and laterally surrounding and immediately adjacent to the second sidewalls of the second multi-layer fin 141 at a second channel region 143 (see FIG. 11). As shown in FIG. 11, the first and second lower dielectric spacers 168, 148 will have essentially co-planar top surfaces and the first and second gates 164, 144 on top of the first and second lower dielectric spacers will also have essentially co-planar top surfaces. Thus, the first gate 164 and the second gate 144 will have essentially equal gate lengths and, thereby essentially equal channel lengths. The first mask 167 and the second mask 147 can then be selectively removed.

Alternatively, if the upper dielectric spacers 169 and 149 were formed so as to be relatively thick, then lithographic patterning, as described above, could be avoided. Instead, the relatively thick upper dielectric spacers 169 and 149 could function as the first mask and the second mask used during the etching of the gate and lower dielectric spacers at process 20.

Figure 12:
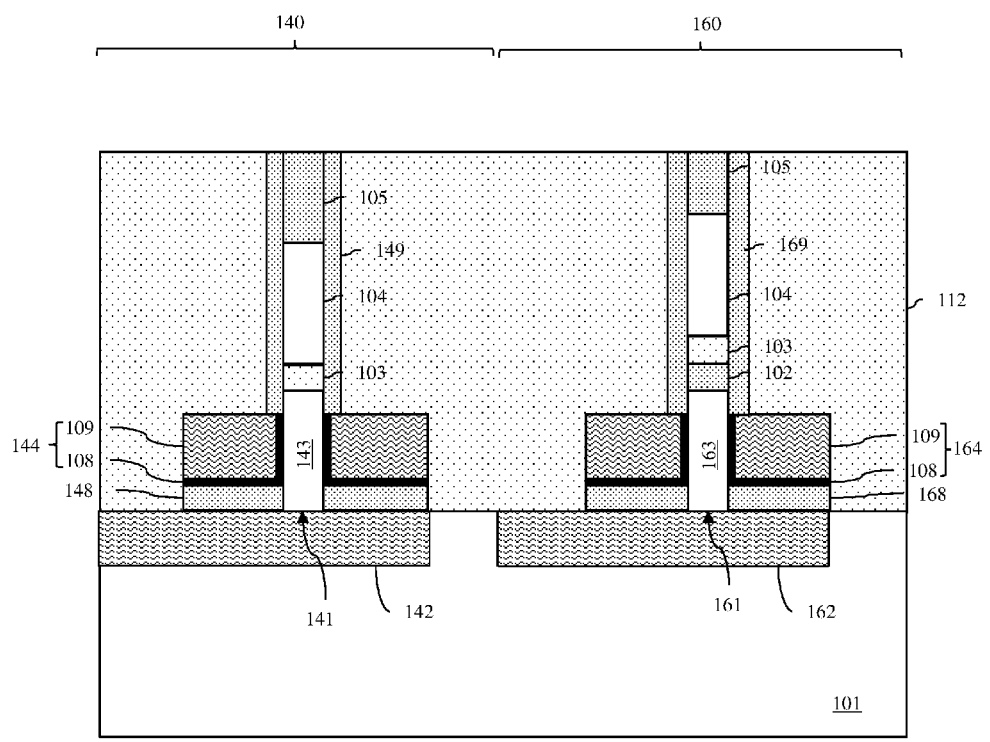
FIG. 12 is a cross-section diagram illustrating a partially completed IC structure formed according to the method of FIG. 1.

Next, a blanket interlayer dielectric (ILD) layer 112 can be deposited onto the partially completed structure and polished (22, see FIG. 12). The ILD layer 112 can be, for example, a silicon oxide layer or a layer of some other suitable ILD material (e.g., borophosphosilicate glass (BPS G), tetraethyl orthosilicate (TEOS), fluorinated tetraethyl orthosilicate (FTEOS), etc.). The polishing process (e.g., a chemical mechanical polishing (CMP) process) can be performed to planarize the top surface of the ILD layer 112 and further to expose the fourth sacrificial layer 105 within both the first multi-layer fin 161 and the second multi-layer fin 141. Since, as mentioned above, the first multi-layer fin 161 and first upper dielectric spacer 169 are initially taller than the second multi-layer fin 141 and second upper dielectric spacer 149, the polishing process used to expose the fourth sacrificial layer 105 within the second multi-layer fin 141 will thin the fourth sacrificial layer 105 within the first multi-layer fin 161 and reduce the height of the first upper dielectric spacer 169 so that the first and second upper dielectric spacers 169, 149 will have approximately equal heights as measured from the top surfaces of the first and second gates 164, 144 to the top surfaces of the first and second upper dielectric spacers 169, 149, respectively. Those skilled in the art will recognize that, due to the CMP or other incoming process non-uniformity, there may be some various in the heights of the first and second upper dielectric spacers 169, 149. Wafer to wafer or wafer center to wafer edge variations may also occur due to process non-uniformity.

Multiple etch processes can then be performed, which remove all of the sacrificial layers from the first multi-layer fin 161 and the second multi-layer fin 141 (24).

Figure 13:
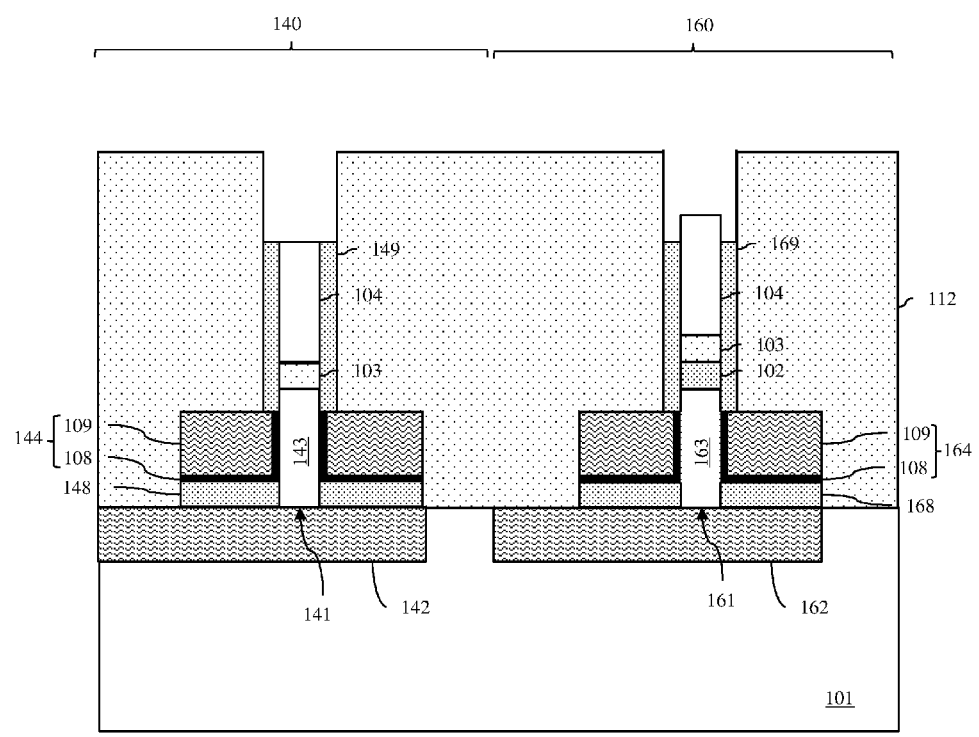
FIG. 13 is a cross-section diagram illustrating a partially completed IC structure formed according to the method of FIG. 1.

Specifically, a selective etch process can be used to selectively remove the fourth sacrificial layer 105 from both the first multi-layer fin 161 and the second multi-layer fin 141 (see FIG. 13). If, as mentioned above, the fourth sacrificial layer 105 and the first and second upper dielectric spacers 169, 149 are made of silicon nitride, the third sacrificial layer 104 is made of amorphous silicon and the ILD layer 112 is made of silicon dioxide, this selective etch process can be selective to silicon nitride over amorphous silicon and silicon dioxide and can also etch back the first and second upper dielectric spacers 169, 149. Etch processes suitable for selectively etching silicon nitride over silicon and silicon dioxide are well known in the art and, thus, the details of these processes have been omitted from this specification in order to allow the reader to focus on the salient aspects of the disclosed method.

Figure 14:
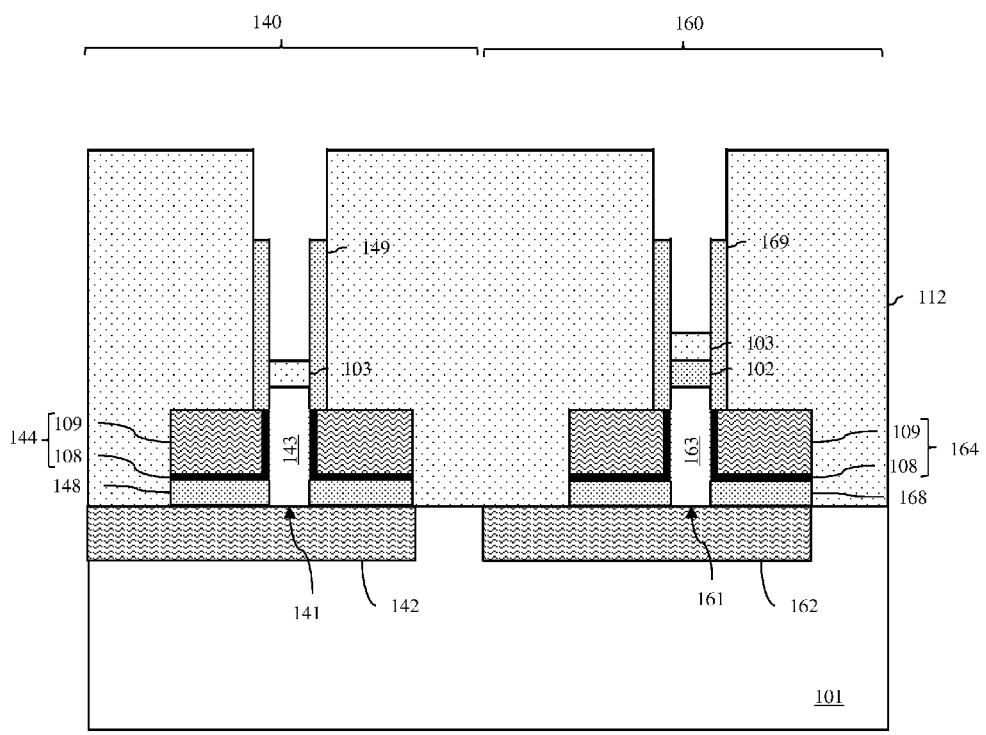
FIG. 14 is a cross-section diagram illustrating a partially completed IC structure formed according to the method of FIG. 1.

An additional selective etch process can be used to selectively remove the third sacrificial layer 104 from both the first multi-layer fin 161 and the second multi-layer fin 141 (see FIG. 14). If, as mentioned above, the third sacrificial layer 104 is made of amorphous silicon, the upper dielectric spacers 169, 149 are made of silicon nitride, and the second sacrificial layer 103 and the ILD layer 112 are made of silicon dioxide, the additional selective etch process can be selective to amorphous silicon over silicon nitride and silicon dioxide. Exemplary selective etch processes that could be used include a hot ammonia (NH3) wet etch process or tetramethylammonium hydroxide (TMAH) wet process.

Figure 15:
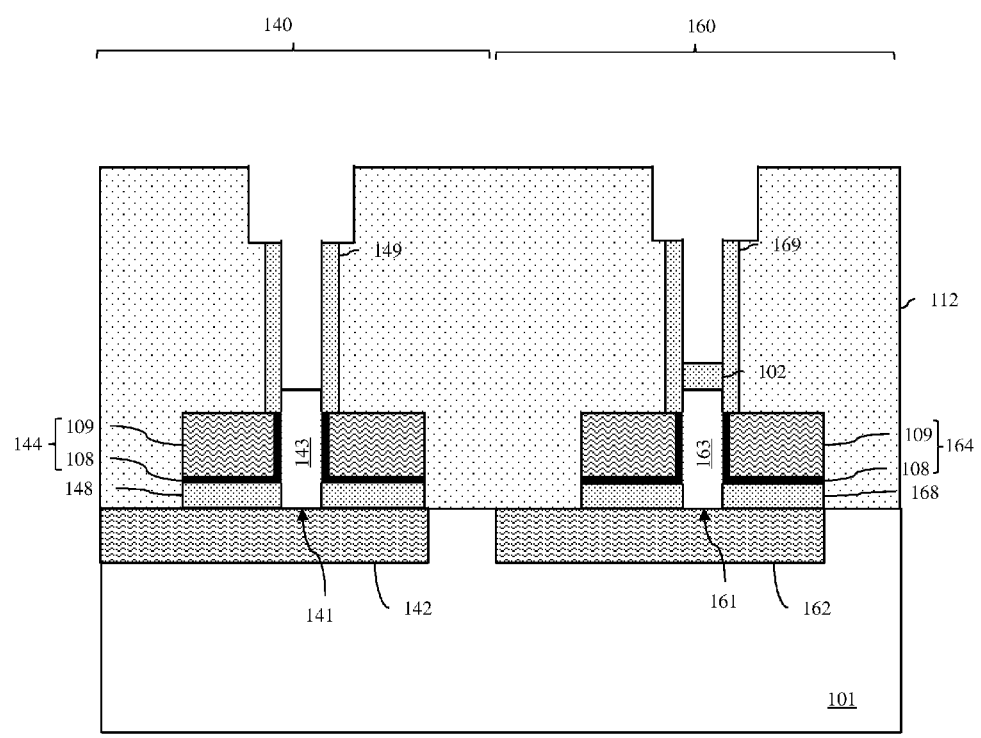
FIG. 15 is a cross-section diagram illustrating a partially completed IC structure formed according to the method of FIG. 1.

A selective isotropic etch process can then be used to selectively remove the second sacrificial layer 103 from both the first multi-layer fin 161 and the second multi-layer fin 141 (see FIG. 15). If, as mentioned above, the second sacrificial layer 103 is made of silicon dioxide, the upper dielectric spacers 169, 149 and the first sacrificial layer 102 are made of silicon nitride, and the semiconductor layer 101 is made of silicon, this selective isotropic etch process can be selective to silicon dioxide over silicon nitride and silicon. It should be noted that, if the ILD layer 112 were also made of silicon dioxide, exposed horizontal and vertical surfaces of the ILD layer 112 would also be etched back, as illustrated. One exemplary selective isotropic etch process that could be used is a diluted hydrofluoric acid (DHF) wet etch process.

Figure 16:
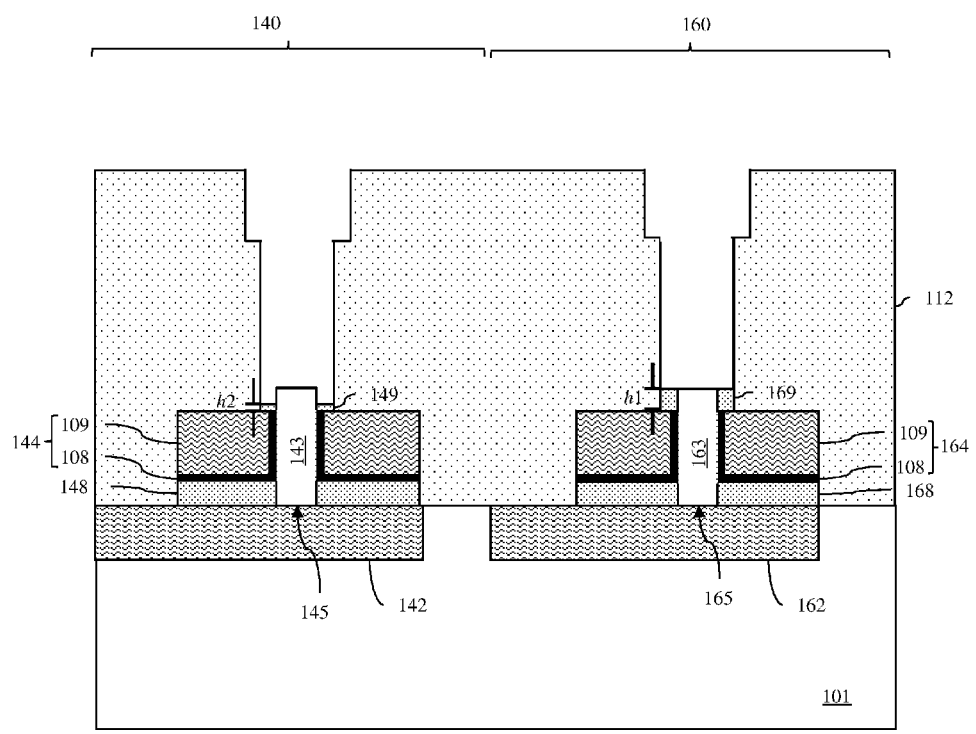
FIG. 16 is a cross-section diagram illustrating a partially completed IC structure formed according to the method of FIG. 1.

Finally, the last of the multiple etch processes used to remove the sacrificial layers can be an additional selective isotropic etch process (see FIG. 16). At this point, the only remaining sacrificial layer will be the first sacrificial layer 102 (i.e., the extra sacrificial layer) on the first multi-layer fin 161. If, as mentioned above, the first sacrificial layer 102 and the upper dielectric spacers 169, 149 are made of silicon nitride, the ILD layer 112 is made of silicon dioxide and the semiconductor layer 101 is made of silicon, this additional selective isotropic etch process can be selective to silicon nitride over silicon dioxide and silicon. As a result, this additional selective isotropic etch process will, not only remove the first sacrificial layer 102 (i.e., the extra sacrificial layer) from the first multi-layer fin 161, but will also etch back exposed surfaces of the first upper dielectric spacer 169 and the second upper dielectric spacer 149. However, due to the presence of the first sacrificial layer 102 (e.g., the extra sacrificial layer) on the first multi-layer fin 161, the second upper dielectric spacer 149 will be etched back to a greater degree than the first upper dielectric spacer 169. That is, this isotropic etch process, the first upper dielectric spacer 169 will be partially protected by the first sacrificial layer 102 (i.e., the extra sacrificial layer) until the first sacrificial layer 102 is removed and, thus, the second upper dielectric spacer 149 will be etched back faster than the first upper dielectric spacer 169.

As a result, following this additional selective isotropic etch process, the first upper dielectric spacer 169 will be taller (as measured from the top surface of the first gate 164 to the top surface of the first upper dielectric spacer 169) than the second upper dielectric spacer 149 (as measured from the top surface of the second gate 144 to the top surface of the second upper dielectric spacer 149). That is, the first upper dielectric spacer 169 will have a first height (h1), the second upper dielectric spacer 149 will have a second height (h2), and the first height (h1) will be greater than the second height (h2). The difference in heights of the first upper dielectric spacer 169 and the second upper dielectric spacer 149 will essentially be equal to the thickness of the first sacrificial layer 102 such that it can be accurately controlled during processing. Thus, for example, if the first sacrificial layer 102 (e.g., the extra sacrificial layer) is deposited so as to have a thickness of approximately 2-5 nm, then the difference in heights of the first upper dielectric spacer 169 and the second upper dielectric spacer 149 following this additional selective isotropic etch process will also be approximately 2-5 nm. Etch processes suitable for selectively and isotropically etching silicon nitride over silicon and silicon dioxide are well known in the art and, thus, the details of these processes have been omitted from this specification in order to allow the reader to focus on the salient aspects of the disclosed method.

It should be noted that, following removal of all of the sacrificial layers from the first multi-layer fin 161 and the second multi-layer fin 141 at process 24, only those portions of the first multi-layer fin 161 and second multi-layer fin 141 that were etched into upper portion 101' of the semiconductor layer 101 will remain. In other words, removing all of the sacrificial layers from the first multi-layer fin 161 and the second multi-layer fin 141, effectively creates single layer semiconductor fins and, particularly, a first semiconductor fin 165 and a second semiconductor fin 145. Additionally, it should be noted that because the final etch process of selectively and isotropically removes the first sacrificial layer 102 (i.e., the extra sacrificial layer) from the first multi-layer fin 161 and also etches back exposed surfaces of the first upper dielectric spacer 169 and the second upper dielectric spacer 149 without etching the semiconductor material below, the method eliminates any height differences in the remaining semiconductor fins 165, 145 while ensuring that first and second upper dielectric spacers have the different heights, as described above. Thus, as illustrated, the top surfaces of the first semiconductor fin 165 and the second semiconductor fin 145 will be approximately level (i.e., co-planar). Additionally, the top surface of the first upper dielectric spacer 169 will be approximately level with the top surface of the first semiconductor fin 165, but the top surface of the second upper dielectric spacer 149 will be below the level of the top surface of the second semiconductor fin 145 by approximately 2-5 nm. Thus, portions of the sidewalls of the second semiconductor fin 145 above the second upper dielectric spacer 149 are exposed.

Figure 17:
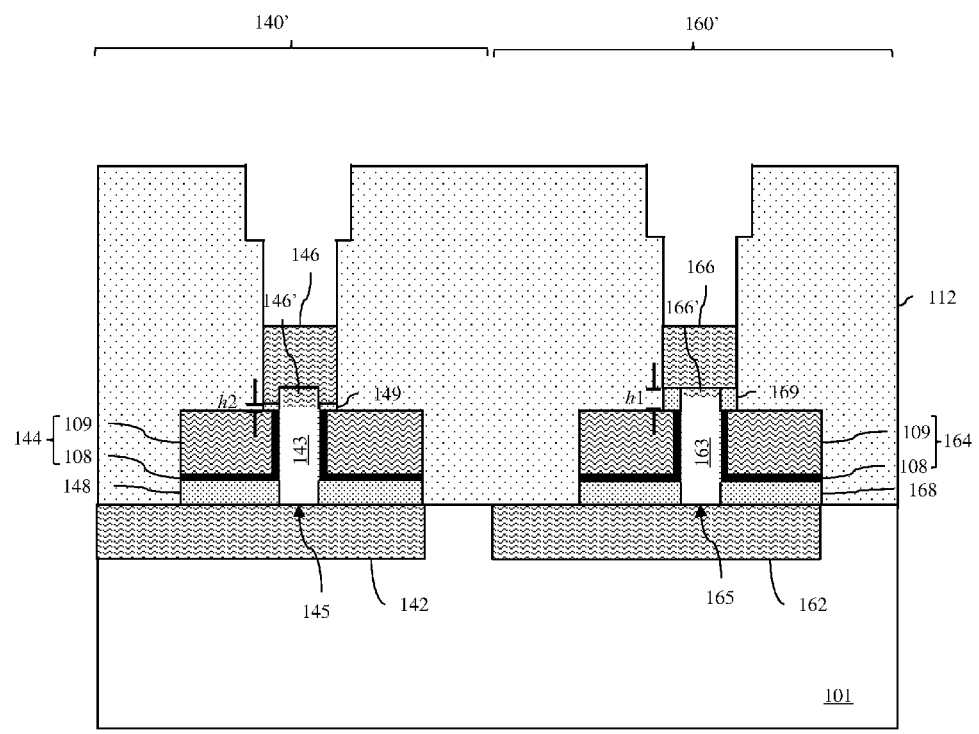
FIG. 17 is a cross-section diagram illustrating a partially completed IC structure formed according to the method of FIG. 1.

After the multiple etch processes are performed, a first upper source/drain region 166 can be formed adjacent to the top of the first semiconductor fin 165 above the first upper dielectric spacer 169 to complete the first VFET 160' and a second upper source/drain region 146 can be formed adjacent to the top of the second semiconductor fin 145 above the second upper dielectric spacer 149 to complete the second VFET 140' (26, see FIG. 17). The upper source/drain regions 166, 146 can be concurrently formed by, for example, epitaxially depositing semiconductor material onto the exposed surfaces of the first and second semiconductor fins 165, 145 above the first and second upper dielectric spacers 169, 149, respectively. That is, the epitaxial semiconductor material will be deposited onto the exposed top surface of the first semiconductor fin 165 and onto the exposed top surface and sidewalls of the second semiconductor fin 145. The semiconductor material can be in situ doped during the epitaxial deposition process so that the upper source/drain regions 166, 146 have the second type conductivity at a relatively high conductivity level (e.g., N+ conductivity in the case of N-type VFETs or P+ conductivity in the case of P-type VFETs). It should be noted that because of the difference in heights between the first and second upper dielectric spacers 169, 149 and, thereby the different amount of exposed surfaces of the first and second semiconductor fins 165, 145 upon which the epitaxial semiconductor material is deposited at process 26, during a subsequently performed dopant activation anneal, there will be a greater amount of dopant diffusion from the second upper source/drain region 146 toward the second channel region 143 of the second VFET as compared to the amount of dopant diffusion from the first upper source/drain region 166 toward the first channel region 163 of the first VFET. As a result, a source/drain dopant diffusion area 146' in the second top end of the second semiconductor fin 145 will be larger than a source/drain dopant diffusion area 166' in the first top end of the first semiconductor fin 165 and, thus, the second upper source/drain region 146 (which includes the source/drain dopant diffusion area 146' within the second semiconductor fin 145) will be closer to the second channel region 143 than the first upper source/drain region 166 (which includes the source/drain dopant diffusion area 166' within the first semiconductor fin 165) is to first channel region 163 and the second VFET will have a lower threshold voltage than the first VFET.

Additional processing can subsequently be performed to complete the IC structure 100 (28). This additional processing can include, but is not limited to, performance of a polishing process (e.g., a CMP process) to planarize the top surface of the ILD layer 112 (see FIG. 18), deposition of at least one additional ILD layer over the ILD layer 112 and upper source/drain regions 166, 146, formation of middle of the line (MOL) contacts to the upper and lower source/drain regions and the gates of the VFETs, performance of back end of the line (BEOL) processing, etc. Optionally, instead polishing the ILD layer 112 down to the top surfaces of the upper source/drain regions 166, 146, as illustrated, the MOL contacts to the upper source/drain regions can be formed within the existing openings in the ILD layer 112 above the upper source/drain regions.

In any case, in the method described above, as result of the first upper dielectric spacer 169 in the first VFET 160' being taller than the second upper dielectric spacer 149 in the second VFET 140', spacing between the first upper source/drain region 166 and the first channel region 163 in the first semiconductor fin 165 of the first VFET 160' will be greater than spacing between the second upper source/drain region 146 and the second channel region 143 in the second semiconductor fin of the second VFET 140'. This difference in spacing between the the upper source/drain regions and the channel regions of the two VFETs causes the first Vt of the first VFET 160' to be greater than the second Vt of the second VFET 140', as discussed above, and, thereby causes the first switching speed of the first VFET 160' to be slower than the second switching speed of the second VFET 140'.

Figure 18:
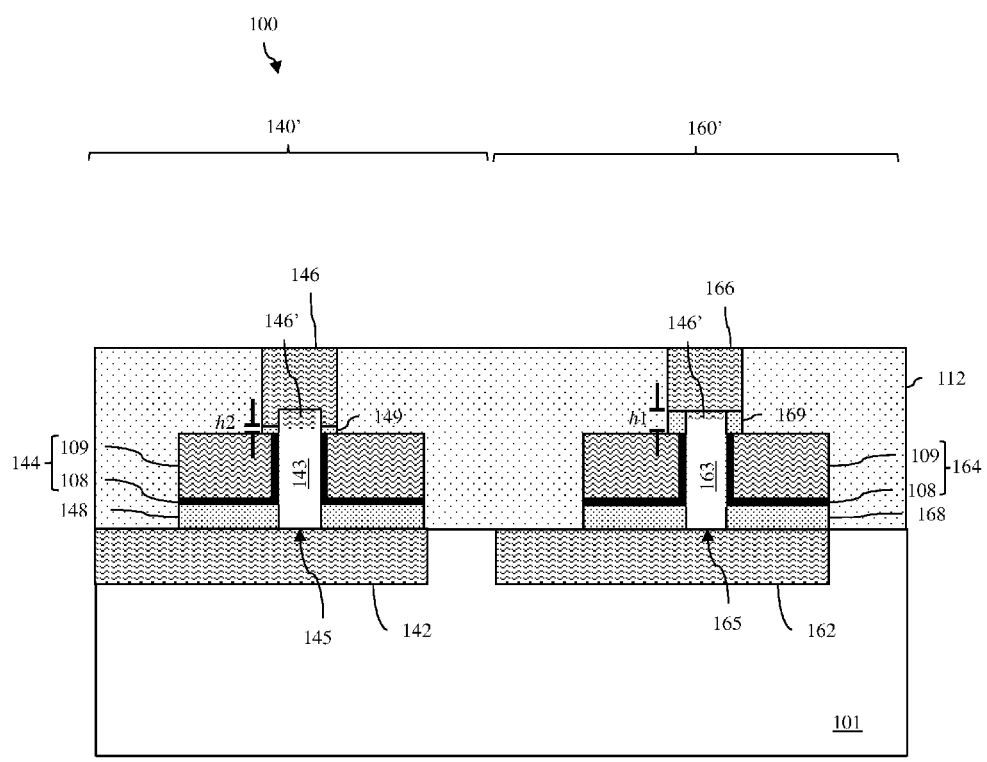
FIG. 18 is a cross-section diagram illustrating an IC structure formed according to the method of FIG. 1.

Referring to FIG. 18, also disclosed herein is an integrated circuit (IC) structure 100 formed according to the method described above so as to have multiple vertical field effect transistors (VFETs), including a first VFET 160' and a second VFET 140', having the same type conductivity (e.g., both P-type VFETs or both N-type VFETs) but different threshold voltages (Vts) and, thereby different switching speeds.

Specifically, the IC structure 100 can include a first VFET 160' and a second VFET 140' on a semiconductor substrate 101. The semiconductor substrate can be a bulk semiconductor substrate (e.g., a bulk silicon substrate), as illustrated. Alternatively, the semiconductor substrate can be a semiconductor layer of a semiconductor-on-insulator wafer (e.g., a silicon-on-insulator (SOI) wafer or any other suitable semiconductor-on-insulator wafer.

The first VFET 160' can have a first lower source/drain region 162 in the semiconductor substrate 101. The first lower source/drain region 162 can be a dopant implant region. Alternatively, the first lower source/drain region 162 can be a doped epitaxial semiconductor region. In any case, the first source/drain regions 162 can be doped so as to have a second type conductivity at a relatively high conductivity level (e.g., N+ conductivity in the case of N-type VFETs or P+ conductivity in the case of P-type VFETs).

The first VFET 160' can further have a first semiconductor fin 165 with a first bottom end above and immediately adjacent to the first lower source/drain region 162 and a first top end opposite the first bottom end. The first semiconductor fin 165 can have a first channel region 163 between the first bottom end and the first top end. The first channel region 163 can be undoped for enhanced mobility. Alternatively, the first channel region 163 can be doped so as to have a first type conductivity at a relatively low conductivity level (e.g., P− conductivity in the case of N-type VFETs or N− conductivity in the case of P-type VFETs).

The first VFET 160' can further have a first lower dielectric spacer 168 (e.g., a first lower silicon nitride spacer) above and immediately adjacent to the first lower source/ drain region 162 and laterally surrounding and immediately adjacent to first sidewalls of the first semiconductor fin 165 near the first bottom end.

The first VFET 160' can further have a first gate 164 above and immediately adjacent to the first lower dielectric spacer 168 and further laterally surrounding and immediately adjacent to the first sidewalls of the first semiconductor fin 165 at the first channel region 163. The first gate 164 can include a gate dielectric layer (e.g., a silicon dioxide gate conductor layer or a high-K gate dielectric layer, as discussed in greater detail above with regard to the method) and a gate conductor layer (e.g., a doped polysilicon layer or a stack of gate conductor layers including a work function metal layer and a fill metal layer, as discussed in greater detail above with regard to the method) on the gate dielectric layer.

The first VFET 160' can further have a first upper dielectric spacer 169 (e.g., a first upper silicon nitride spacer) above and immediately adjacent to the first gate 164 and laterally surrounding and immediately adjacent to the first sidewalls of the first semiconductor fin 165 near the first top end. The first upper dielectric spacer 169 has a first height (h1). Top surfaces of the first upper dielectric spacer 169 and the first semiconductor fin 165 can be approximately level (i.e., co-planar).

The first VFET 160' can further have a first upper source/drain region 166. The first upper source/drain region 166 can include in-situ doped epitaxial semiconductor material above and immediately adjacent to the first top end of the first semiconductor fin 165 and further extending laterally over and immediately adjacent to the first upper dielectric spacer 169. The first upper source/drain region 166 can further include a first source/drain dopant diffusion area 166' within the first top end of the first semiconductor fin 165. The first upper source/drain region 166 (including the in-situ doped epitaxial semiconductor material and the first upper source/drain dopant diffusion area 166') can have a second type conductivity at a relatively high conductivity level (e.g., N+ conductivity in the case of N-type VFETs or P+ conductivity in the case of P-type VFETs).

Thus, in the first VFET 160', the first semiconductor fin 165 extends essentially vertically from the first lower source/drain region 162 to the first upper source/drain region 166. Additionally, first lower and upper dielectric spacers 168, 169 physically separate the first gate 164 from the first lower and upper source/drain regions 162, 166, respectively. That is, the first lower dielectric spacer 168 is positioned laterally adjacent to the first semiconductor fin 165 and stacked between the first lower source/drain region 162 and the first gate 164. Furthermore, the first upper dielectric spacer 169 is positioned laterally adjacent to the first semiconductor fin 165 and is stacked between the first gate 164 and the first upper source/drain region 166.

Similarly, the second VFET 140' can have a second lower source/drain region 142 in the semiconductor substrate 101. The second lower source/drain region 142 can be a dopant implant region. Alternatively, the second lower source/drain region 142 can be a doped epitaxial semiconductor region. In any case, the second lower source/drain regions 142 can be doped so as to have a second type conductivity at a relatively high conductivity level (e.g., N+ conductivity in the case of N-type VFETs or P+ conductivity in the case of P-type VFETs).

The second VFET 140' can further have a second semiconductor fin 145 with a second bottom end above and immediately adjacent to the second lower source/drain region 142 and a second top end opposite the second bottom end. Top surfaces of the second semiconductor fin 145 and the first semiconductor fin 165 can be approximately level (i.e., co-planar). Thus, the first semiconductor fin 145 and the second semiconductor fin 165 can have approximately equal heights as measured from the top surface of the substrate. The second semiconductor fin 145 can have a second channel region 143 between the second bottom end and the second top end. The second channel region 143 can be undoped for enhanced mobility. Alternatively, the second channel region 143 can be doped so as to have a second type conductivity at a relatively low conductivity level (e.g., P– conductivity in the case of N-type VFETs or N– conductivity in the case of P-type VFETs).

The second VFET 140' can further have a second lower dielectric spacer 148 (e.g., a second lower silicon nitride spacer) above and immediately adjacent to the second lower source/drain region 142 and laterally surrounding and immediately adjacent to second sidewalls of the second semiconductor fin 145 near the second bottom end.

The second VFET 140' can further have a second gate 144 above and immediately adjacent to the second lower dielectric spacer 148 and further laterally surrounding and immediately adjacent to the second sidewalls of the second semiconductor fin 145 at the second channel region 143. The second gate 144 can include a gate dielectric layer (e.g., a silicon dioxide gate conductor layer or a high-K gate dielectric layer, as discussed in greater detail above with regard to the method) and a gate conductor layer (e.g., a doped polysilicon layer or a stack of gate conductor layers including a work function metal layer and a fill metal layer, as discussed in greater detail above with regard to the method) on the gate dielectric layer.

The second VFET 140' can further have a second upper dielectric spacer 149 (e.g., a second upper silicon nitride spacer) above and immediately adjacent to the second gate 144 and laterally surrounding and immediately adjacent to the second sidewalls of the second semiconductor fin 145 near the second top end. The second upper dielectric spacer 149 is shorter than the first upper dielectric spacer 169. That is, the second upper dielectric spacer 149 has a second height (h2) that is less than the first height (h1) of the first upper dielectric spacer 169.

The second VFET 140' can further have a second upper source/drain region 146. The second upper source/drain region 146 can include in-situ doped epitaxial semiconductor material immediately adjacent to the second top end of the second semiconductor fin 145 and further extending laterally over and immediately adjacent to the second upper dielectric spacer 149. Specifically, the in-situ doped epitaxial semiconductor material can be immediately adjacent to the top surface of the second semiconductor fin 145 and also immediately adjacent to portions of the second sidewalls of the second semiconductor fin 145 above the second upper dielectric spacer 149. The second upper source/drain region 146 can further include a second source/drain dopant diffusion area 146' within the second top end of the second semiconductor fin 145. The second upper source/drain region 146 (including the in-situ doped epitaxial semiconductor material and the second source/drain dopant diffusion area 146') can be doped so as to have a second type conductivity at a relatively high conductivity level (e.g., N+ conductivity in the case of N-type VFETs or P+ conductivity in the case of P-type VFETs).

Thus, in the second VFET 140', the second semiconductor fin 145 extends essentially vertically from the second lower source/drain region 142 to the second upper source/drain region 146. Additionally, second lower and upper dielectric spacers 148, 149 physically separate the second gate 144 from the second lower and upper source/drain regions 142, 146, respectively. That is, the second lower dielectric spacer 148 is positioned laterally adjacent to the second semiconductor fin 145 and stacked between the second lower source/drain region 142 and the second gate 144. Furthermore, the second upper dielectric spacer 149 is positioned laterally adjacent to the second semiconductor fin 145 and is stacked between the second gate 144 and the second upper source/drain region 146.

Additionally, as shown in FIG. 18, in this IC structure 100, the first lower dielectric spacer 168 of the first VFET 160' and the second lower dielectric spacer 148 of the second VFET 140' will have essentially co-planar top surfaces. Furthermore, the first gate 164 on top of the first lower dielectric spacer 168 in the first VFET 160' and the second gate 144 on top of the second lower dielectric spacer 148 in the second VFET 140' will also have essentially co-planar top surfaces. Thus, the first gate 164 and the second gate 144 will have essentially equal gate lengths and, thereby essentially equal channel lengths.

As described above, the first VFET 160' and the second VFET 140' are almost identical in structure. However, due to the method used to form these VFETs, the first upper dielectric spacer 169 of the first VFET 160' is taller than the second upper dielectric spacer 149 of the second VFET 140'. The difference in heights can be selectively controlled and can, for example, be between 2 and 10 nm (e.g., approximately 2-5 nm). In any case, due to the difference in heights between the first and second upper dielectric spacers 169, 149, the epitaxial semiconductor material of the first upper source/drain region 166 is grown immediately adjacent to the top surface only of the first semiconductor fin 165, whereas the epitaxial semiconductor material of the second upper source/drain region 146 is grown immediately adjacent to the top surface and portions of the sidewalls of the second semiconductor fin 145 above the second upper dielectric spacer 149. As a result, the second source/drain dopant diffusion area 146' in the second top end of the second semiconductor fin 145 is larger than the first source/drain dopant diffusion area 166' in the first top end of the first semiconductor fin 165. Thus, the second upper source/drain region 146 (which includes in-situ doped epitaxial semiconductor material and the second source/drain dopant diffusion area 146' within the second semiconductor fin 145) is closer to the second channel region 143 than the first upper source/drain region 166 (which includes the in-situ doped epitaxial semiconductor material and the first source/drain dopant diffusion area 166' within the first semiconductor fin 165) is to first channel region 163. This difference in spacing between the channel regions and the upper source/drain regions of the two VFETs causes the first Vt of the first VFET 160' to be greater than the second Vt of the second VFET 140' and, thereby causes the first switching speed of the first VFET 160' to be slower than the second switching speed of the second VFET 140'.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a stack of sacrificial layers on a semiconductor layer, the stack having a first portion and a second portion, the first portion comprising an extra sacrificial layer as compared to the second portion;
    etching a first multi-layer fin in the first portion and the semiconductor layer and a second multi-layer fin in the second portion and the semiconductor layer; and
    concurrently forming a first vertical field effect transistor using the first multi-layer fin and a second vertical field effect transistor using the second multi-layer fin, the concurrently forming comprising:
        forming a first upper dielectric spacer on the first multi-layer fin and a second upper dielectric spacer on the second multi-layer fin; and
        performing multiple etch processes that remove the sacrificial layers from the first multi-layer fin and the second multi-layer fin, wherein the multiple etch processes comprise:
            initial etch processes that remove all of the sacrificial layers except the extra sacrificial layer on the first multi-layer fin; and
            an isotropic etch process that removes the extra sacrificial layer from the first multi-layer fin and etches back the first upper dielectric spacer and the second upper dielectric spacer,
        wherein, during the isotropic etch process, the first upper dielectric spacer is partially protected by the extra sacrificial layer until the extra sacrificial layer is removed such that the second upper dielectric spacer is etched back faster than the first upper dielectric spacer and such that, following the isotropic etch process, the first upper dielectric spacer is taller than the second upper dielectric spacer.

2. The method of claim 1, wherein the first vertical field effect transistor has a first threshold voltage and the second vertical field effect transistor has a second threshold voltage that is less than the first threshold voltage.

3. The method of claim 1, wherein the first vertical field effect transistor has a first switching speed and the second vertical field effect transistor has a second switching speed that is faster than the first switching speed.

4. The method of claim 1, wherein a thickness of the extra sacrificial layer is approximately equal to a difference in heights of the first upper dielectric spacer and the second upper dielectric spacer, following the isotropic etch process.

5. The method of claim 1, wherein a thickness of the extra sacrificial layer is approximately 2-5 nm and wherein a difference in heights of the first upper dielectric spacer and the second upper dielectric spacer following the isotropic etch process is approximately 2-5 nm.

6. The method of claim 1, further comprising:
before the performing of the multiple etch processes, forming the following:
a first lower source/drain region adjacent to the first multi-layer fin and a second lower source/drain region adjacent to the second multi-layer fin;
a first lower dielectric spacer adjacent to the first multi-layer fin above the first lower source/drain region and a second lower dielectric spacer adjacent to the second multi-layer fin above the second lower source/drain region; and
a first gate adjacent to the first multi-layer fin above the first lower dielectric spacer and a second gate adjacent to the second multi-layer fin above the second lower dielectric spacer, wherein the first gate and the second gate have essentially equal gate lengths and essentially co-planar top surfaces that are below a level of the sacrificial layers; and,
after the performing of the multiple etch processes, forming a first upper source/drain region fin above the first upper dielectric spacer and a second upper source/drain region above the second upper dielectric spacer.

7. The method of claim 6, wherein the first upper dielectric spacer, the second upper dielectric spacer, the first lower dielectric spacer, and the second lower dielectric spacer comprise silicon nitride spacers.

8. A method comprising:
providing a semiconductor layer;
forming a stack of sacrificial layers on the semiconductor layer, the forming of the stack comprising:
forming a first sacrificial layer on a first device region of the semiconductor layer;
forming a second sacrificial layer on a second device region of the semiconductor layer and on the first sacrificial layer;
forming a third sacrificial layer over the second sacrificial layer; and
forming a fourth sacrificial layer over the third sacrificial layer such that the stack of sacrificial layers has a first portion on the first device region and a second portion on the second device region and such that, within the first portion, the first sacrificial layer is an extra sacrificial layer;

etching a first multi-layer fin in the first portion and the semiconductor layer and a second multi-layer fin in the second portion and the semiconductor layer; and
concurrently forming a first vertical field effect transistor using the first multi-layer fin and a second vertical field effect transistor using the second multi-layer fin, the concurrently forming comprising:
forming a first upper dielectric spacer above a first gate and on first sidewalls of the first multi-layer fin and a second upper dielectric spacer above a second gate and on second sidewalls of the second multi-layer fin; and
performing multiple etch processes that remove the sacrificial layers from the first multi-layer fin and the second multi-layer fin to create a first semiconductor fin and a second semiconductor fin, respectively,
wherein the multiple etch processes comprise:
initial etch processes that remove all of the sacrificial layers except the extra sacrificial layer on the first multi-layer fin; and
an isotropic etch process that removes the extra sacrificial layer from the first multi-layer fin and etches back the first upper dielectric spacer and the second upper dielectric spacer,
wherein, during the isotropic etch process, the first upper dielectric spacer is partially protected by the extra sacrificial layer until the extra sacrificial layer is removed such that the second upper dielectric spacer is etched back faster than the first upper dielectric spacer and such that, following the isotropic etch process, the first upper dielectric spacer is positioned laterally adjacent to the first semiconductor fin, the second upper dielectric spacer is positioned laterally adjacent to the second semiconductor fin, and the first upper dielectric spacer is taller than the second upper dielectric spacer.

9. The method of claim 8, wherein the first sacrificial layer comprises a sacrificial silicon nitride layer, the second sacrificial layer comprises a sacrificial silicon dioxide layer, the third sacrificial layer comprises a sacrificial amorphous silicon layer and the fourth sacrificial layer comprises an additional sacrificial silicon nitride layer.

10. The method of claim 8, wherein the first vertical field effect transistor has a first threshold voltage and the second vertical field effect transistor has a second threshold voltage that is less than the first threshold voltage.

11. The method of claim 8, wherein the first vertical field effect transistor has a first switching speed and the second vertical field effect transistor has a second switching speed that is faster than the first switching speed.

12. The method of claim 8, wherein a thickness of the extra sacrificial layer is approximately equal to a difference in heights of the first upper dielectric spacer and the second upper dielectric spacer, following the isotropic etch process.

13. The method of claim 8, wherein a thickness of the extra sacrificial layer is approximately 2-5 nm and wherein a difference in heights of the first upper dielectric spacer and the second upper dielectric spacer following the isotropic etch process is approximately 2-5 nm.

14. The method of claim 8, further comprising:
before the performing of the multiple etch processes, forming the following:
a first lower source/drain region adjacent to the first multi-layer fin and a second lower source/drain region adjacent to the second multi-layer fin;
a first lower dielectric spacer adjacent to the first multi-layer fin above the first lower source/drain region and a second lower dielectric spacer adjacent to the second multi-layer fin above the second lower source/drain region, wherein the first gate is adjacent to the first multi-layer fin above the first lower dielectric spacer and the second gate is adjacent to the second multi-layer fin above the second lower dielectric spacer, and wherein the first gate and the second gate have essentially equal gate lengths and essentially co-planar top surfaces that are below a level of the sacrificial layers; and after the performing of the multiple etch processes, forming a first upper source/drain region adjacent the first semiconductor fin above the first upper dielectric spacer and a second upper source/drain region adjacent to the second semiconductor fin above the second upper dielectric spacer.

15. The method of claim 14, wherein the first upper dielectric spacer, the second upper dielectric spacer, the first lower dielectric spacer, and the second lower dielectric spacer comprise silicon nitride spacers.

\* \* \* \* \*